United States Patent
Langley et al.

[11] Patent Number: 6,109,343
[45] Date of Patent: Aug. 29, 2000

[54] LOW EMI EMISSIONS HEAT SINK DEVICE

[75] Inventors: Philip David Langley, Granite Bay; Douglas Boone, Newcastle, both of Calif.

[73] Assignee: Hewlett-Packard Company, Palo Alto, Calif.

[21] Appl. No.: 09/497,556

[22] Filed: Feb. 3, 2000

Related U.S. Application Data

[63] Continuation of application No. 09/067,248, Apr. 27, 1998, Pat. No. 6,044,899.

[51] Int. Cl.⁷ .................................................. F28D 15/00
[52] U.S. Cl. ........................ 165/104.33; 165/104.23; 62/3.1; 62/259.2; 361/700; 257/715
[58] Field of Search ................ 165/104.21, 104.33, 165/104.26, 104.23, 185; 62/3.1, 259.2; 257/715; 361/700, 724, 687, 707; 174/15.2

[56] References Cited

U.S. PATENT DOCUMENTS

| | | |
|---|---|---|
| 3,024,298 | 3/1962 | Goltsos et al. |
| 3,209,062 | 9/1965 | Scholz. |
| 3,739,234 | 6/1973 | Bylund et al. .................. 317/234 R |
| 4,332,135 | 6/1982 | Barclay et al. ................... 62/3 |
| 4,681,995 | 7/1987 | Ahern et al. ................. 219/10.51 |
| 4,819,011 | 4/1989 | Yokota ............................ 346/76 |
| 5,343,940 | 9/1994 | Jean ........................... 165/104.33 |
| 5,365,403 | 11/1994 | Vinciarelli et al. ................ 361/707 |
| 5,598,320 | 1/1997 | Toedtman et al. ................ 361/687 |
| 5,731,954 | 3/1998 | Cheon .............................. 361/699 |
| 5,755,278 | 5/1998 | Shinohara et al. ............. 651/104.33 |
| 5,764,483 | 6/1998 | Ohashi et al. .................... 361/699 |
| 5,808,869 | 9/1998 | Donahoe et al. ................. 361/704 |
| 5,842,514 | 12/1998 | Zapach et al. ............... 165/104.33 |
| 5,894,887 | 4/1999 | Kelsey et al. ................ 165/104.26 |
| 5,910,883 | 6/1999 | Cipolla et al. .................... 361/687 |
| 5,917,699 | 6/1999 | Hung et al. ....................... 361/697 |

FOREIGN PATENT DOCUMENTS

| | | | |
|---|---|---|---|
| 3-30400 | 2/1991 | Japan .................................. 361/700 |
| 3-110892 | 5/1991 | Japan .................................. 361/700 |
| 6-21674 | 1/1994 | Japan .................................. 361/687 |
| 103-015 | 7/1983 | U.S.S.R. .............................. 361/700 |

*Primary Examiner*—Christopher Atkinson

[57] ABSTRACT

A low electromagnetic radiation emissions heat sink that dissipates heat away from an integrated circuit package by means of conduction to the electronic chassis. The heat sink may also include a ferrite ring for reducing electromagnetic radiation emissions from the integrated circuit package by increasing the electrical impedance of the EMI transmission path between the integrated circuit package and the electronic chassis, thus reducing the capacitive coupling and RFI concerns of conductive heat dissipation. The heat sink of the present invention may also include fins that are external to the electronic chassis for greater heat dissipation by means of external air convection.

7 Claims, 4 Drawing Sheets

LOW EMI EMISSIONS HEAT SINK DEVICE

CROSS REFERENCE TO RELATED APPLICATION(S)

This is a continuation of application Ser. No. 09/067,248 filed on Apr. 27, 1998 now U.S. Pat. No. 6,044,899.

FIELD OF THE INVENTION

The present invention relates generally to the field of integrated circuit heat dissipation and more particularly to heat sinks. In particular, this invention provides a heat sink with electro-magnetic radiation interference shielding.

BACKGROUND OF THE INVENTION

It is well known in the electronic industry to provide substrate is, presumably in the form of printed circuit boards, which carry upon one or both sides, electronic components which provide various electronic functions. It is also known that electronic components generate heat and certain components also emit electromagnetic radiation which interferes with the operation of other components on a printed circuit board or with other electronic devices not mounted upon the board. A board mounted electronic component may be in the form of an integrated circuit or a chip. The tendency in modern design is for integrated circuits or chips to become smaller and faster in operation. A problem which exists with faster operation of smaller circuits is that they tend to increase in temperature and may overheat to such a degree that permanent damage may result unless steps are taken to avoid such situations.

In this case, heat removal becomes a prime necessity. However, heat removal considerations may be contradictory to the considerations necessary for overcoming electromagnetic emission problems. This is because for the avoidance of EMI emissions, a surrounding shield is normally necessary for an integrated circuit and this detracts from the removal of heat because such a shield tends to act as a heat insulator.

Generally, heat sinks are mounted to an outer surface of an integrated circuit package to facilitate the removal of heat from the integrated circuit contained therein. Most heat sinks are thermally conductive and have a plurality of fins to provide a large surface area, which allows heat to be more efficiently dissipated by natural or forced air flow. Generally, heat sinks transfer heat from the integrated circuit to the air inside the computer chassis by means of convection. This increases the overall temperature within the computer chassis. For chips with greater heat dissipation needs, fans are also used in conjunction with heat sinks to increase the rate of heat dissipation. Fans may be arranged to direct heat from inside the computer chassis towards holes in the computer chassis, thus moving hot air to the outside of the computer chassis. These fans are generally very noisy, consume power and take-up space inside the electronic chassis.

There is a need for a heat sink device that can more efficiently dissipate heat to the outside of the computer chassis, while at the same time reducing EMI emissions from the integrated circuit to the chassis. It would also be advantageous to be able to dissipate heat without the use of fans.

SUMMARY OF THE INVENTION

The above and other aspects of the present invention may be accomplished in a low EMI emissions heat sink device that dissipates heat away from an IC package by means of conduction to the top, sides and bottom of the electronic chassis. The heat sink of the present invention may also have a ferrite ring to reduce EMI emissions from the IC package. The heat sink of the present invention may also have fins that are outside of the electronic chassis for greater heat dissipation without the use of a fan.

BRIEF DESCRIPTION OF THE DRAWINGS

The above and other objects, features and advantages of the present invention will be better understood by reading the following more particular description of the invention, presented in conjunction with the following drawings, wherein.

DETAILED DESCRIPTION OF THE PREFERRED EMBODIMENT

Figure 1:
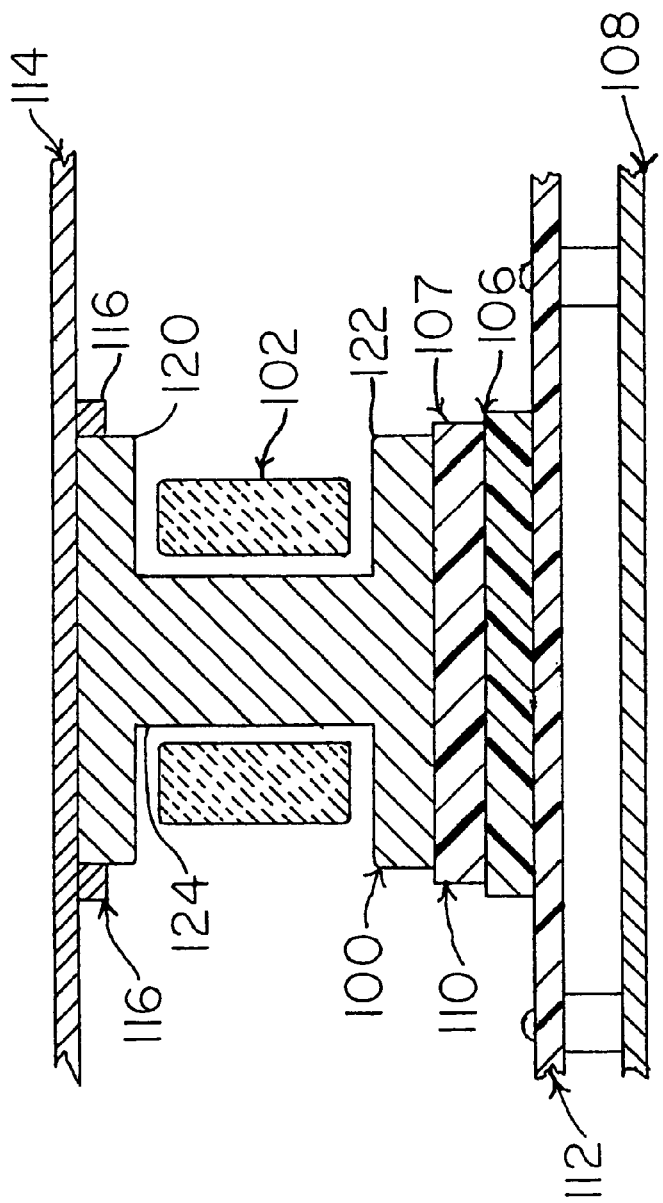
FIG. 1 shows a cross-sectional view of a low EMI emissions heat sink according to a first embodiment of the present invention.

FIG. 1 illustrates a cross-sectional view of a low EMI emissions heat sink 100 according to a first embodiment of the present invention. Heat sink 100 has a narrow midsection 124 and wider first and second end sections 120 and 122. End section 122 sides on top of integrated circuit package 110, which is plugged into socket 106. Socket 106 is mounted on a printed circuit board 112, which is mounted to electronic chassis bottom 108 by any known means. There may be a thermal compound or a thermally conductive elastomer 104. Top end section 120 is located between locators 116 of the electronic chassis cover 114. The electronic chassis may be any known material, but is generally made of steel. The heat sink 100 may be made of any known heat sink material, such as aluminum. A ferrite ring 102 is attached to the narrow midsection 124 of heat sink 100.

Typically, heat sinks transfer heat to the air inside the chassis via convection. However, since the heat sink 100 of the present invention is in contact with electronic chassis cover 114, heat from the integrated circuit package is transferred to the chassis via conduction.

This permits the air temperature inside the electronic chassis, and the resulting thermal stress on other electronic components to be lower than that which is typical with convective type heat sinks. The conduction type heat dissipation also eliminates the need for a fan required in most convective applications. This greatly improves the reliability, lowers the power consumption, and creates a virtually silent computer. Moreover, the heat sink 100 may act as a structural member, further stabilizing the top cover 114 of the electronic chassis, thus creating a simpler, less expensive enclosure.

The ferrite ring 102 attached to the midsection 124 of heat sink 100 reduces EMI emissions to an acceptable level while still providing good thermal performance. This is accomplished through increased electrical impedance of the EMI transmission path between the integrated circuit package 110 and the electronic chassis, thus reducing the capacitive coupling and RFI concerns that has limited previous attempts at the heat conduction approach.

Figure 2:
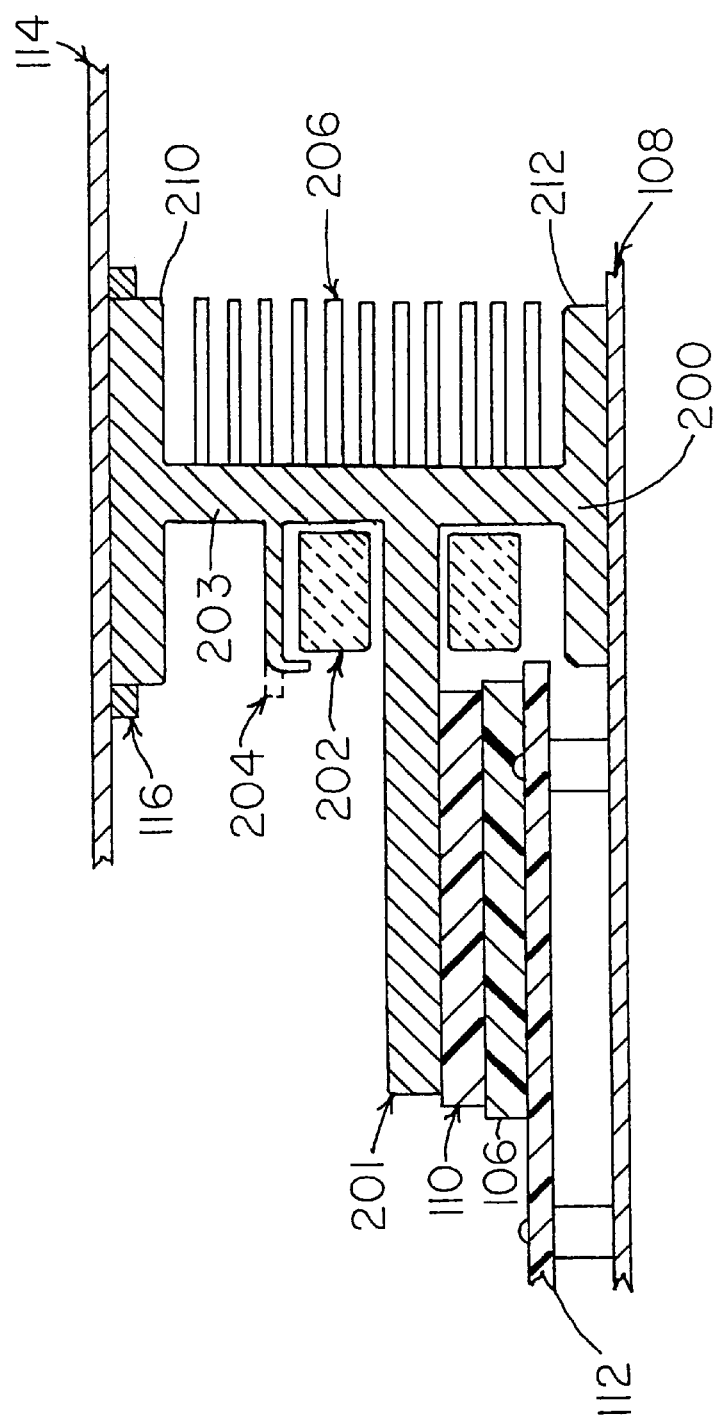
FIG. 2 shows a cross-sectional view of a low EMI emissions heat sink according to a second embodiment of the present invention.

FIG. 2 illustrates a cross-sectional view of a low EMI emissions heat sink 200 according to a second embodiment of the present invention. Heat sink 200 comprises a narrow midsection 203 and first and second wider end sections 210 and 212. Heat sink 200 may include heat dissipation fins 206 on at least one side. Heat sink 200 may also include a heat pipe 201 that rests on top of integrated circuit package 110 mounted in socket 106 attached to printed circuit board 112, which is attached to electronic chassis bottom 108 by any known means. There may be a thermally conductive compound or elastomer between the integrated circuit package 110 and the heat pipe 201. There may also be a ferrite ring 202 wrapped around the heat pipe 201 for increasing the electrical impedance of the EMI transmissions path between the integrated circuit package 110 and the electronic chassis top 114 and bottom 108. The heat sink 200 may include a tab 204, such that once the ferrite ring 202 is mounted on the heat pipe, the tab 204 is bent, and thus prevents the ferrite ring 202 from sliding along the heat pipe 201.

As can be seen in FIG. 2, the first end 210 of the heat sink 200 is located within locators 116 of the electronic chassis top 114 and the second end 212 is resting on the electronic chassis bottom. Accordingly, the heat sink 200 may provide structural support to the electronic chassis. Moreover, this embodiment will put less mechanical stress on the integrated circuit package 110 than the first embodiment as this heat sink 200 extends between the top and bottom surfaces of the electronic chassis, rather than resting on the top surface of the integrated circuit package 110.

Also, fins 206 may be located on a side of the heat sink that has some form of air circulation. As noted previously with the first embodiment, ferrite ring 202 provides electrical impedance of the EMI transmission path between the integrated circuit package 110 and the electronic chassis, thus reducing the capacitive coupling and RFI concerns that have limited heat conduction type heat sinks in the past. As in the first embodiment, heat sink 200 may be any known heat sink material, such as aluminum.

Figure 3:
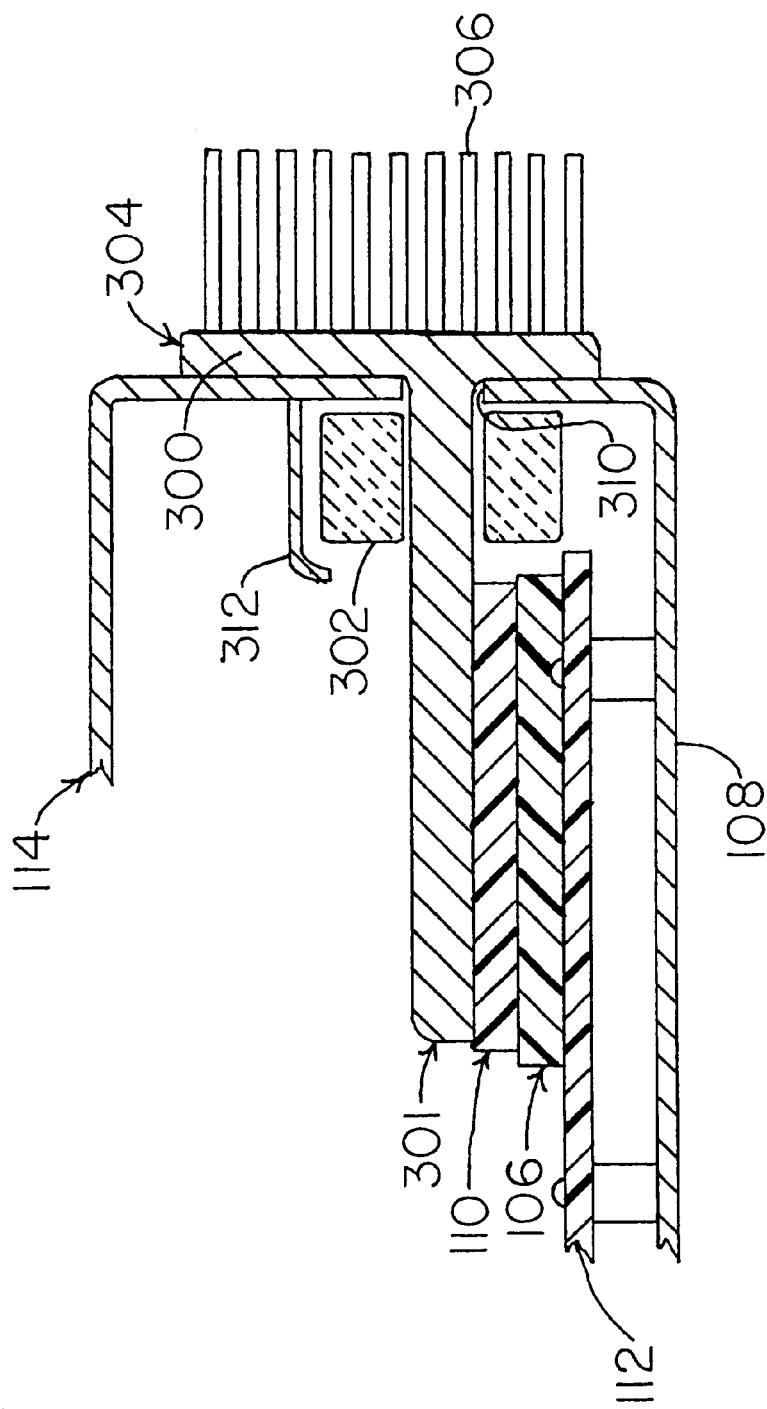
FIG. 3 shows a cross-sectional view of a low EMI emissions heat sink according to a third embodiment of the present invention.

FIG. 3 illustrates a cross-sectional view of a low EMI emissions heat sink 300 according to a third embodiment of the present invention. Heat sink 300 is attached to the outside of the electronic chassis along side 304 of the heat sink 300 by any known means, such as screws, rivets, glue, etc. Heat pipe 301 extends through hole 310 in the electronic chassis and rests on top of integrated circuit package 110 that is plugged into socket 106 mounted on printed circuit board 112 which is attached to electronic chassis bottom 108 by any known means. There may be a thermally conductive compound or elastomer between the integrated circuit package 110 and the heat pipe 301.

Heat sink 300 may have fins 306 along side 304 on the outside of the electronic chassis. This embodiment permits the heat sink 300 to transfer heat to the electronic chassis and to the external fins 306 via convection. The external fins permit heat dissipation by means of external air movement and conduction. This is an improvement over the prior art as the heat dissipation from the integrated circuit 110 does not raise the internal temperature of the electronic chassis, but rather transfers the heat to the outside of the electronic chassis.

Heat pipe 301 has a ferrite ring 302 mounted thereon, which reduces EMI emissions by increasing the electrical impedance of the EMI transmission path between the integrated circuit package 110 and the electronic chassis thus reducing the capacitive coupling and RFI concerns that have limited the heat conduction approach in the past. The ferrite ring 302 may be held in place by a tab 312 extending from the electronic chassis top 114. The end of tab 312 may be bent after the ferrite ring is installed on the heat pipe 301.

Figure 4:
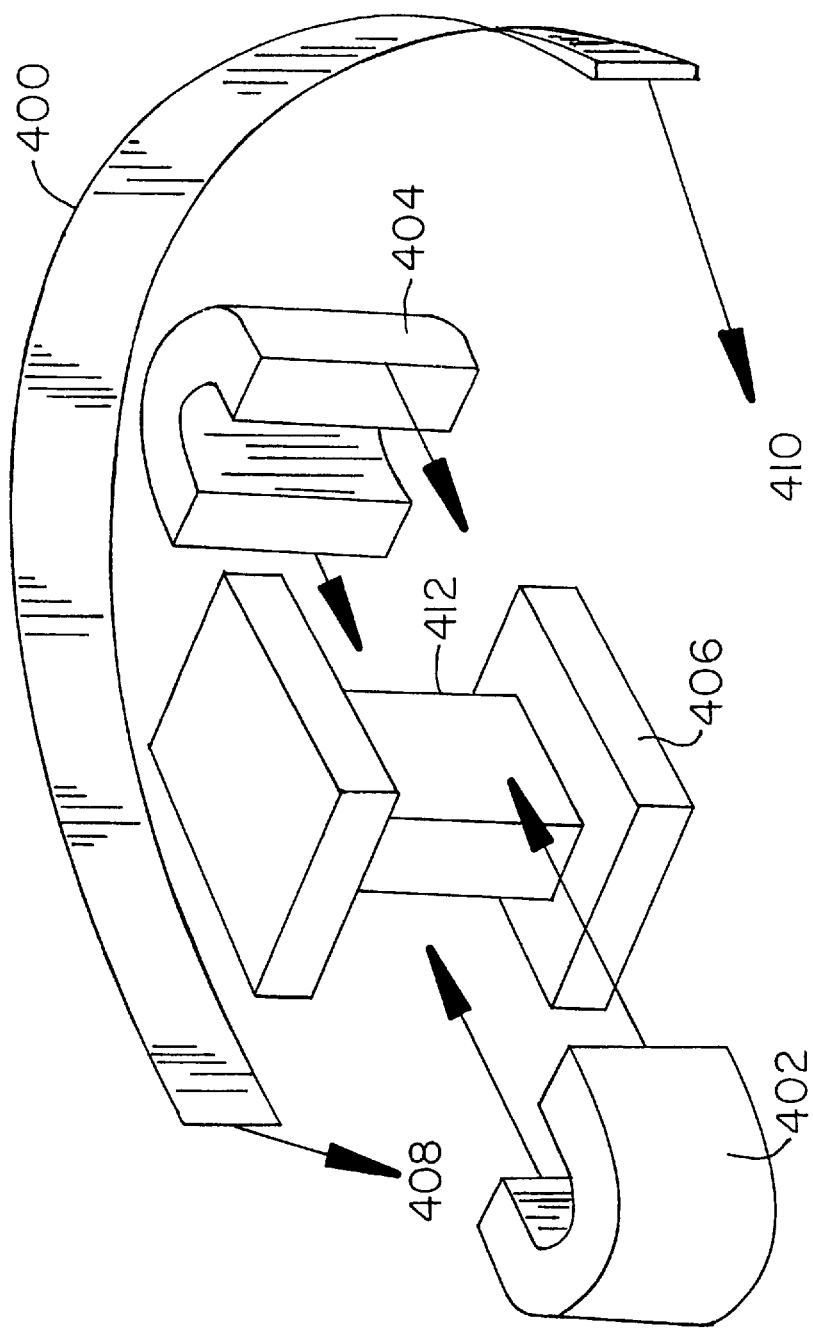
FIG. 4 shows a blown-up perspective view illustrating how ferrite rings may be attached to a heat sink according to the present invention.

FIG. 4 illustrates a blown-up perspective view detailing how the ferrite rings 102, 202 and 302 may be attached to a heat sink according to the present invention. Specifically, two ferrite cores 402 and 404 may be placed around a center section 412 of a heat sink 406 and then held in place by means of tape or a heat-shrink ring 400. Ends 408 and 410 are wrapped around the ferrite cores 402 and 404 and then secured together. This technique would be necessary for the heat sink of FIG. 1. However, the ferrite rings of FIGS. 2 and 3 may alternatively be integral rings as they may be slid onto heat pipes 201 and 301.

The foregoing description of the present invention has been presented for purposes of illustration and description. It is not intended to be exhaustive or to limit the invention to the precise form disclosed, and other modifications and variations may be possible in light of the above teachings. For example, the heat sink 100, 200 and 300 may be of any known heat sink material. The embodiment was chosen and described in order to best explain the principles of the invention and its practical application to thereby enable others skilled in the art to best utilize the invention in various embodiments and various modifications as are suited to the particular use contemplated. It is intended that the appended claims be construed to include other alternative embodiments of the invention except insofar as limited by the prior art.

What is claimed is:

1. A heat sink assembly for dissipating heat from an integrated circuit package mounted on a printed circuit board assembly within an electronic chassis having a top, a bottom and at least one side wall, said heat sink assembly comprising:

a heat sink having a first end, a mid section and a second end, wherein said first end is in contact with said top of said electronic chassis and said second end is in contact with said integrated circuit package; and a ferrite ring attached to said mid section of said heat sink, such that said ferrite ring increases the electrical impedance of EMI transmissions from said integrated circuit package and said electronic chassis.

2. The heat sink assembly according to claim 1 wherein said ferrite ring comprises at least two ferrite cores retained about said mid section of said heat sink by means of tape.

3. The heat sink assembly according to claim 1 wherein said ferrite ring comprises at least two ferrite cores retained about said mid section of said heat sink by means of a heat-shrink ring.

4. The heat sink assembly of claim 1, wherein said heat sink comprises a member having a substantially I shaped cross-section.

5. The heat sink assembly of claim 4, wherein said heat sink comprises aluminum.

6. A heat sink assembly for dissipating heat from an integrated circuit mounted within within a chassis having a top, said heat sink assembly comprising:

a heat sink having an I shaped cross-section defining a first horizontal end portion and a second horizontal end portion connected by a vertical mid-section portion, the first horizontal end section contacting the top of the chassis, the second horizontal end section contacting the integrated circuit; and a ferrite ring surrounding the vertical mid-section portion of said heat sink, said ferrite ring increasing an electrical impedance to EMI transmissions from the integrated circuit and the chassis.

7. A heat sink assembly for dissipating heat from an integrated circuit contained within a chassis having a top, said heat sink assembly comprising:

heat sink means contacting the top of the chassis and the integrated circuit for conducting heat from the integrated circuit to the top of the chassis; and ferrite ring means surrounding said heat sink means for increasing the electrical impedance to EMI transmissions from the integrated circuit and the chassis.

* * * * *

UNITED STATES PATENT AND TRADEMARK OFFICE
CERTIFICATE OF CORRECTION

PATENT NO.   : 6,109,343
DATED        : August 29, 2000
INVENTOR(S)  : Philip David Langley et al.

It is certified that error appears in the above-identified patent and that said Letters Patent is hereby corrected as shown below:

<u>Column 4,</u>
Line 62, after "mounted" delete "within"

Signed and Sealed this

Twentieth Day of August, 2002

Attest:

Attesting Officer

JAMES E. ROGAN
*Director of the United States Patent and Trademark Office*